US 12,482,742 B2

(12) United States Patent
Xie et al.

(10) Patent No.: US 12,482,742 B2
(45) Date of Patent: Nov. 25, 2025

(54) ENHANCED LINERLESS VIAS

(71) Applicant: International Business Machines Corporation, Armonk, NY (US)

(72) Inventors: Ruilong Xie, Niskayuna, NY (US); Oleg Gluschenkov, Tannersville, NY (US); Yasir Sulehria, Niskayuna, NY (US); Julien Frougier, Albany, NY (US); Veeraraghavan S. Basker, Schenectady, NY (US)

(73) Assignee: International Business Machines Corporation, Armonk, NY (US)

( * ) Notice: Subject to any disclaimer, the term of this patent is extended or adjusted under 35 U.S.C. 154(b) by 818 days.

(21) Appl. No.: 17/646,572

(22) Filed: Dec. 30, 2021

(65) Prior Publication Data
US 2023/0215800 A1  Jul. 6, 2023

(51) Int. Cl.
*H01L 23/522* (2006.01)
*H01L 21/768* (2006.01)
*H01L 23/528* (2006.01)
*H10D 30/01* (2025.01)
*H10D 30/67* (2025.01)
*H10D 62/10* (2025.01)
*H10D 64/01* (2025.01)

(52) U.S. Cl.
CPC .... *H01L 23/5226* (2013.01); *H01L 21/76804* (2013.01); *H01L 21/76879* (2013.01); *H01L 23/5283* (2013.01); *H10D 30/031* (2025.01); *H10D 30/6713* (2025.01); *H10D 30/6729* (2025.01); *H10D 30/6735* (2025.01); *H10D 62/118* (2025.01); *H10D 64/01* (2025.01)

(58) Field of Classification Search
CPC ............ H10D 30/024; H10D 30/6219; H10D 30/6211; H01L 23/5226; H01L 21/76804
See application file for complete search history.

(56) References Cited

U.S. PATENT DOCUMENTS

| | | | |
|---|---|---|---|
| 8,796,135 | B2 | 8/2014 | Oganesian et al. |
| 9,583,417 | B2 | 2/2017 | Sun et al. |
| 10,355,017 | B1 | 7/2019 | Nakatsuji et al. |
| 10,690,973 | B2 | 6/2020 | Yueh et al. |
| 2010/0176483 | A1 | 7/2010 | Iguchi |
| 2016/0163645 | A1 | 6/2016 | Kamineni et al. |
| 2017/0271512 | A1 | 9/2017 | Adusumilli et al. |
| 2020/0020626 | A1 | 1/2020 | Yang |
| 2021/0233861 | A1 | 7/2021 | Chang et al. |

(Continued)

FOREIGN PATENT DOCUMENTS

WO    2021101909 A1    5/2021

OTHER PUBLICATIONS

Wei, Z., Li, X., & Mao, J. (Sep. 2014). An accurate RLGC circuit model for dual tapered TSV structure. Journal of Semiconductors, 35(9), 095008-095008.

*Primary Examiner* — Christine S. Kim
*Assistant Examiner* — Andrew Victor Prostor
(74) *Attorney, Agent, or Firm* — Patterson + Sheridan, LLP

(57) ABSTRACT

A via connection layer for an electronic package and method for fabricating a via connection layer are provided. The via connection layer includes asymmetric via(s) formed in the via connection layer. The asymmetric via include a first sidewall with a first slope angle in a first direction and a second sidewall, where the second sidewall includes a second slope angle in the first direction.

14 Claims, 7 Drawing Sheets

(56) References Cited

U.S. PATENT DOCUMENTS

| | | | | |
|---|---|---|---|---|
| 2021/0407999 A1* | 12/2021 | Huang | ................. | H10D 62/121 |
| 2022/0406777 A1* | 12/2022 | Wu | ..................... | H10D 84/853 |
| 2023/0099214 A1* | 3/2023 | Miao | ................. | H10D 30/6757 |
| | | | | 257/288 |

* cited by examiner

US 12,482,742 B2

ENHANCED LINERLESS VIAS

BACKGROUND

The present invention relates to vias (electrical connections) in semiconductor devices, and more specifically, to vias with geometries that allow boosted drive currents to propagate through the vias.

In some semiconductor devices, such as fin field-effect transistor (FinFET) devices, various developments have increased the capabilities of the devices to drive/transmit increasingly large currents through the devices; however, vias between various layers in the devices may limit the amount of current/signal that may be processed through the device.

SUMMARY

An example embodiment includes an electronic package. The electronic package may include: a first layer; a second layer; and a via layer between the first layer and the second layer. The via layer may include an asymmetric via formed in the via layer, where the asymmetric via may include a first sidewall with a first slope angle in a first direction between the first layer and the second layer. The asymmetric via may also include a second sidewall with a second slope angle in the first direction between the first layer and the second layer, where the second slope angle is different from the first slope angle.

Another example embodiment includes a via connection layer. The via connection layer may include: an asymmetric via formed in the via connection layer, where the asymmetric via may include: a first sidewall, where the first sidewall may include a first slope angle in a first direction; and a second sidewall, where the second sidewall includes a second slope angle in the first direction, where the second slope angle is different from the first slope angle.

One general aspect includes a method. The method includes: forming a via mold over a metal contact, where the via mold may include a symmetrical tapered cross-sectional profile; applying a directional etch to the via mold, where the directional etch alters a first sidewall of the via mold and increases a bottom width of the via mold, where the altered first sidewall may include a first slope angle in a first direction; and forming an asymmetric via in the via mold, where the asymmetric via may include a first sidewall with the first slope angle in the first direction and a second sidewall with second slope angle in the first direction, where the first slope angle is different than the second slope angle.

DETAILED DESCRIPTION

A nanosheet (also referred to as a gate-all-around design, multi-bridge channel, or nanobeam) is a sheet of material that confines charge transport to a two-dimensional space. Development in nanosheets utilized in FinFET devices and other devices has increased the width of the nanosheets. The increased width in the nanosheets also boosts or increases a current or electrical signal which may be driven through the nanosheet device. Additionally, while described herein in relation to nanosheet devices, other devices such as FinFET, nanowire, planar devices, etc. have also increased the signal transmissibility of various components or layers of the devices where other components of the devices limit the performance of the signal transmission.

In some examples, the nanosheets width have increased such that a limiting factor to the performance of the nanosheets (or other example device layers) is the connection structures in the device/electronic package which surround the nanosheet. For example, via connections which connect the nanosheet layers to metal lines and/or power rails in the electronic package may limit the current that can be driven though the nanosheet. The vias, electronic package, and methods described herein provide vias with geometries that allow for large current/signals driven to or from surrounding connecting layers to be efficiently transmitted to connecting layers.

Figure 1:
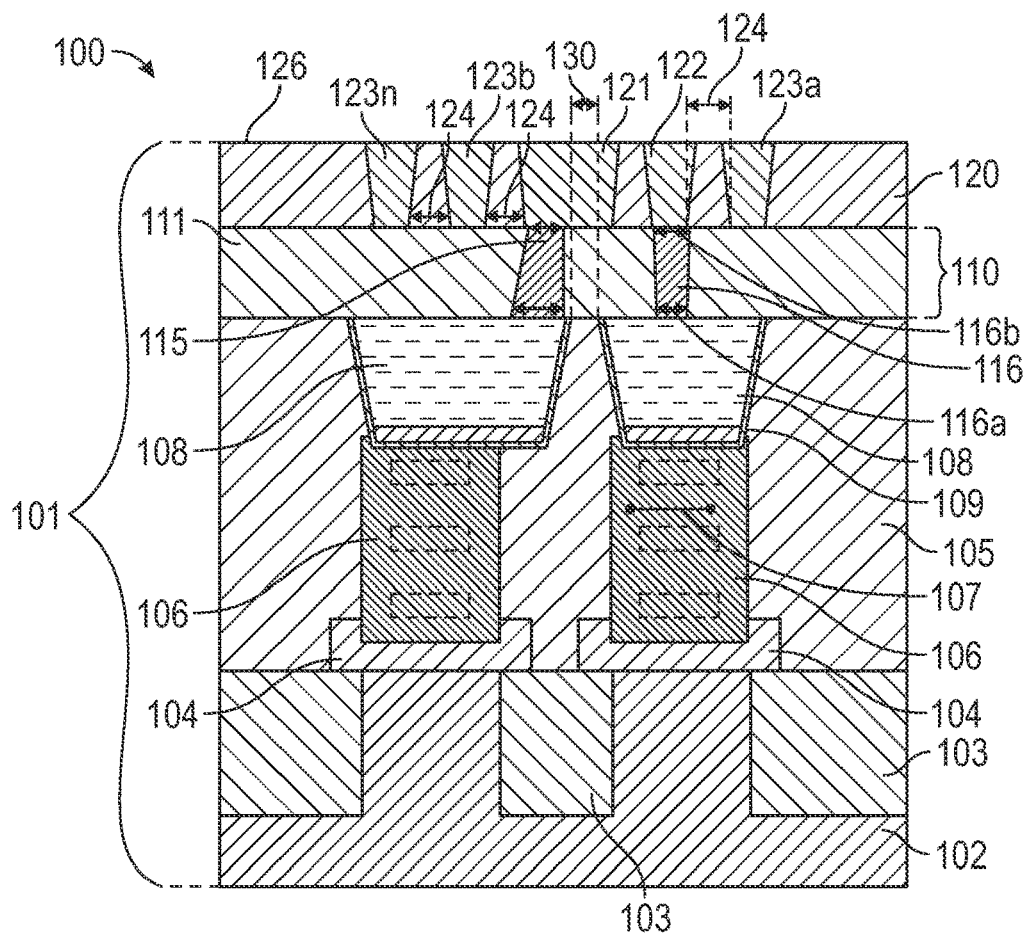
FIG. 1 illustrate an electronic package, according to embodiments described herein.

FIG. 1 illustrate an electronic package, package 101, according to embodiments described herein. FIG. 1 illustrates a cross-section view 100 of the package 101. The package 101 includes a substrate layer 102, a shallow trench isolation (STI) layer 103, and a first interlayer dielectric (ILD) layer 105. The first ILD layer 105 also includes bottom dielectric isolation (BDI) layers 104. In this example, the first ILD layer 105 also includes source/drain S/D regions 106 of a nanosheet device such as the package 101. In FIG. 1, the S/D regions 106 are formed on the BDI layers 104, but in other embodiments, the S/D regions 106 may be directly formed on the substrate layer 102.

The size of the S/D regions 106 is related to an initial width of nanosheets 107. As described above, widths of nanosheets 107 have increased where larger currents/signals may be driven through the nanosheet layers to other interconnecting layers. In some examples, the connections from the S/D regions 106 to layers such as metal layer 120 is achieved through metal contacts and vias. For example, contacts 108 formed on the S/D regions 106 provide an electrical connection from the S/D regions 106 to vias in a via layer, such as via connection layer 110. The contacts 108 may include liners 109 between the contacts 108, the S/D regions 106 and the first ILD layer 105.

The contacts 108 connect to the metal layer 120 through the via connection layer 110. In some examples, the via connection layer 110 includes an ILD material 111 as well as a plurality of vias formed through the ILD material 111. The plurality of vias include via 115 and via 116. In this example, the via 115 is a linerless asymmetric via, where the via is formed via directional etching and without a liner between the via and other layers in the package 100. In some examples, the asymmetric via 115 may include liners, especially, sidewall liners. For ease of illustration, only two vias are shown in FIG. 1; however, the via connection layer 110 may include a plurality of additional linerless asymmetric vias similar to the via 115 and a plurality of vias similar to via 116 as described herein. The vias 115 and 116 provide signal/electrical connection from the contacts 108 to at least one metal line in the metal layer 120, where the metal line is on a top surface of the vias and/or the connection layer 110. The metal layer 120 includes an ILD material 126 with metal lines 122, 123a-n and power rail 121 formed in the ILD material 126.

Figure 2:
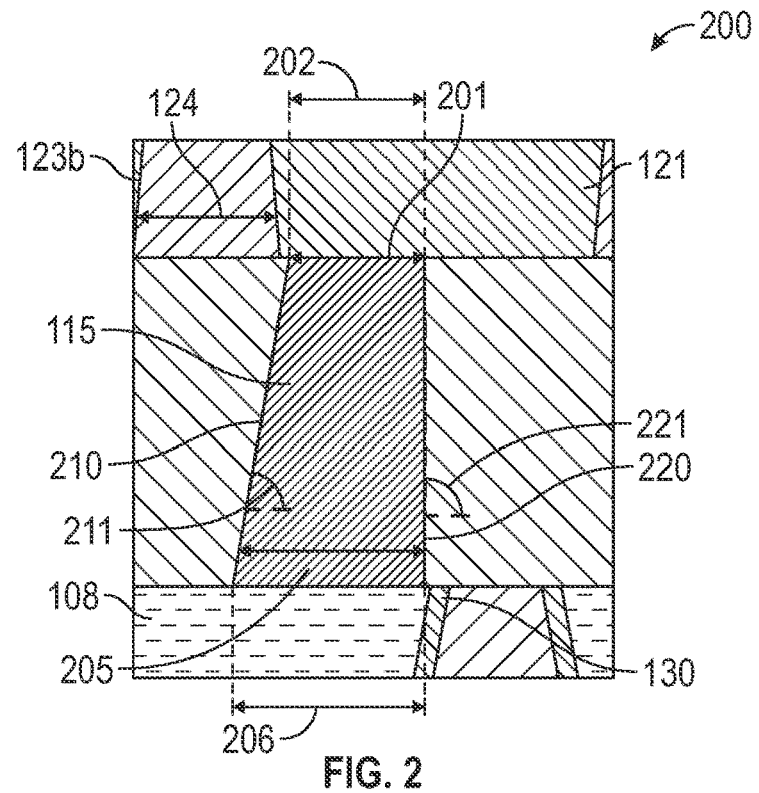
FIG. 2 illustrates a via in an electronic package, according to embodiments described herein.

In this example, the via 115 is an asymmetric via (in contrast to a symmetric via, such as via 116) where a bottom width of cross-sectional profile of the via is larger than a top width (i.e., the top width of the linerless asymmetric via has a shorter length than a bottom width) of the linerless asymmetric via of the cross-sectional profile as discussed in more detail in relation to FIG. 2. In contrast, the via 116 is a tapered symmetrical via, where the cross-sectional profile is a symmetric shape. In some examples, the geometry of the cross-sectional profiles of the vias may increase resistance in the via and limit currents that pass through the via.

For example, the via 116 includes a top width 116b and a bottom width 116a. In some examples, the bottom width 116a and the top width 116b limit a current that is able to transmit through the via. For example, if the bottom width 116a and/or the top width 116b were larger or longer, the resistance of the via 116 would be smaller, thus allowing larger currents to pass through the via 116. In some examples, a pitch between metal lines in the metal layer 120, prevents the top width 116b from being enlarged. For example, a critical dimension (CD) of the metal lines in the metal layer 120 and metal-to-metal space 124 are combined to form a limiting pitch for the metal layer. For example, increasing top width 116b would cause electrical interference between the via 116 and other metal lines such as the metal line 123a and/or other vias in the via connection layer 110.

Additionally, the contacts 108 may also prevent widths of the vias to be increased. For example, tip-to-tip (T2T) distance requirements between the contacts 108, such as T2T 130 may prevent the vias in the via connection layer 110 from increasing overall widths since increasing the widths may cause the vias to encroach the T2T 130. In order to allow for increased widths of the vias, the methods described herein (e.g., in relation to FIG. 3) use directional etching to form an asymmetric via such as the via 115 as described in more detail in relation to FIG. 2.

FIG. 2 illustrates the via 115 in an electronic package, such as package 101, according to embodiments described herein. Cross-section 200 includes a sub-cross-section view of the via 115 as well as the contacts 108, power rail 121, and metal line 123b. In some examples, the via 115 is positioned on a top surface of a contact from the contacts 108. The via 115 includes a top side 201, a bottom side 205, a first sidewall 210, and a second sidewall 220. The top side 201 includes a top width 202, the bottom side 205 includes a bottom width 206. In this example, the bottom width 206 is larger than the top width 202. Additionally, the sidewall 210 has a first angle 211 in a first direction between the contacts 108 and the power rail 121. The sidewall 220 has a second angle 221 in the first direction between the contacts 108 and the power rail 121. In FIG. 2, the differing widths between the bottom width 206 and top width 202 and the varying angles between the first angle 211 and second angle 221 form a vertically asymmetric cross-section profile for the via 115.

In some examples, the bottom width 206 is larger than the top width 116b shown in FIG. 1, which allows for the via 115 to carry a higher current from/to the S/D regions 106 and from/to the power rail 121. In some examples, the bottom width 206, while larger than the top width 116b, does not encroach on T2T 130 between the contacts 108. In some examples, the bottom width 206 is enlarged in a directional etch process describe in relation to FIGS. 3 and 4F, where the directional etch increases the width of the via without encroaching the T2T 130 between the contacts 108.

Figure 3:
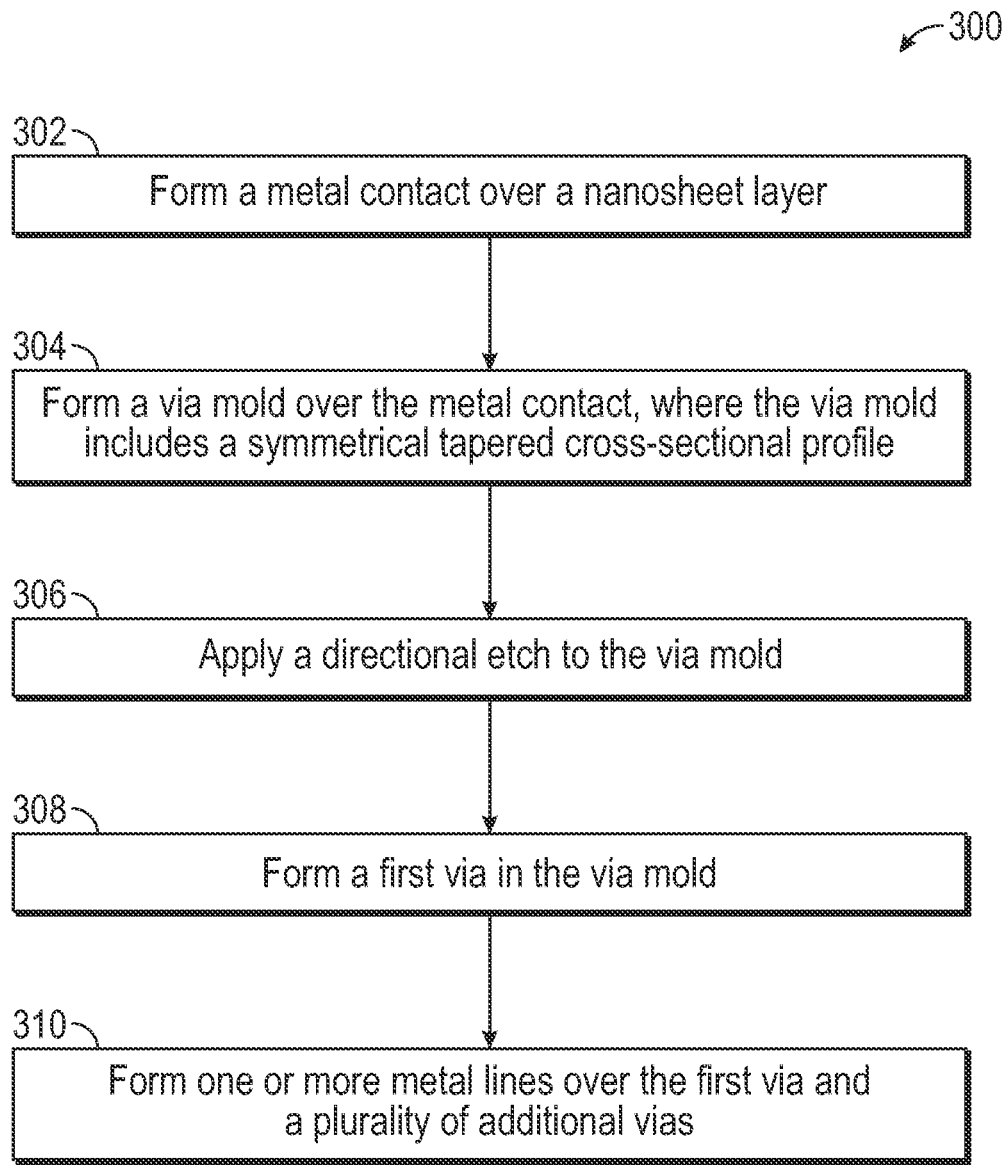
FIG. 3 is a flowchart of a method for fabrication of an electronic package, according to embodiments of the present disclosure.
Figure 4A:
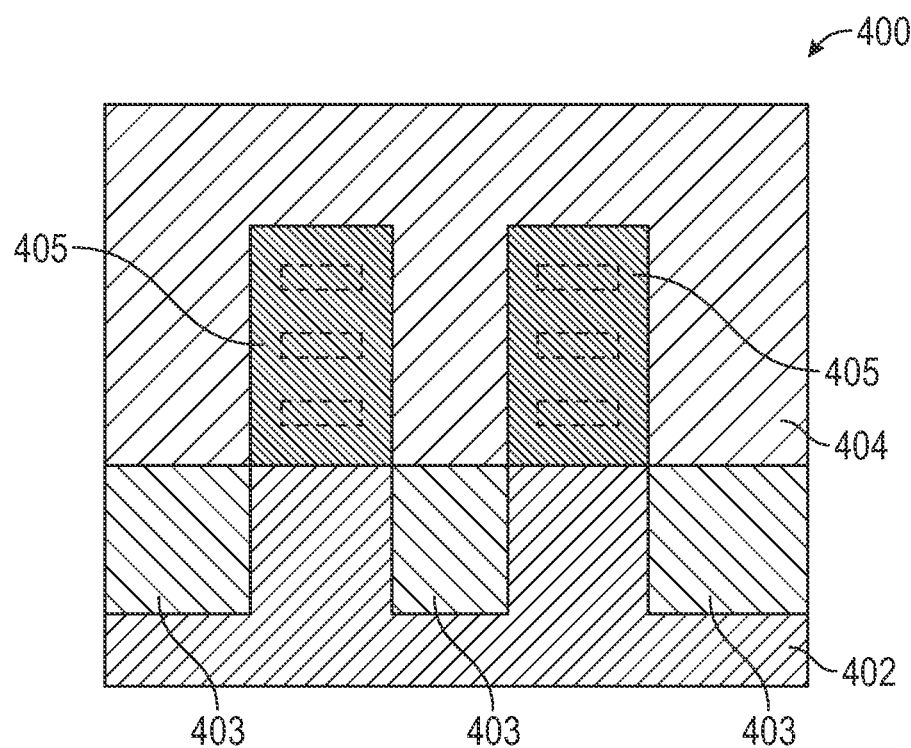
FIGS. 4A-I illustrate a cross-section of an electronic package during fabrication, according to embodiments of the present disclosure.
Figure 4B:
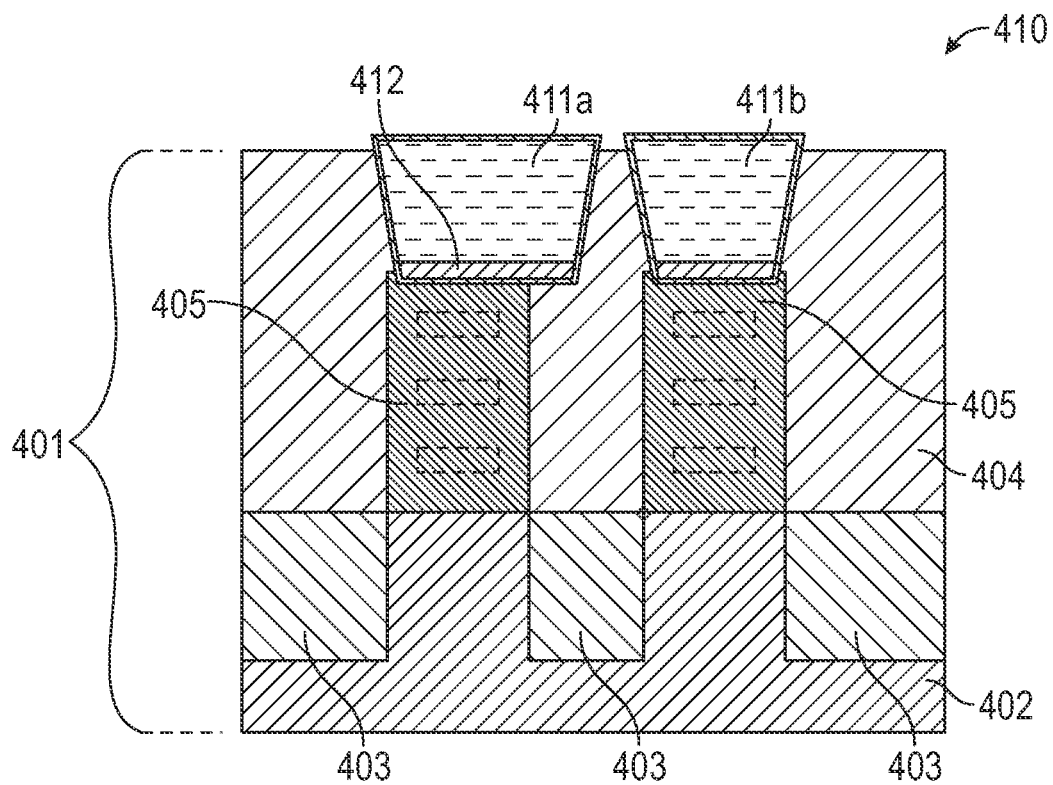
Figure 4C:
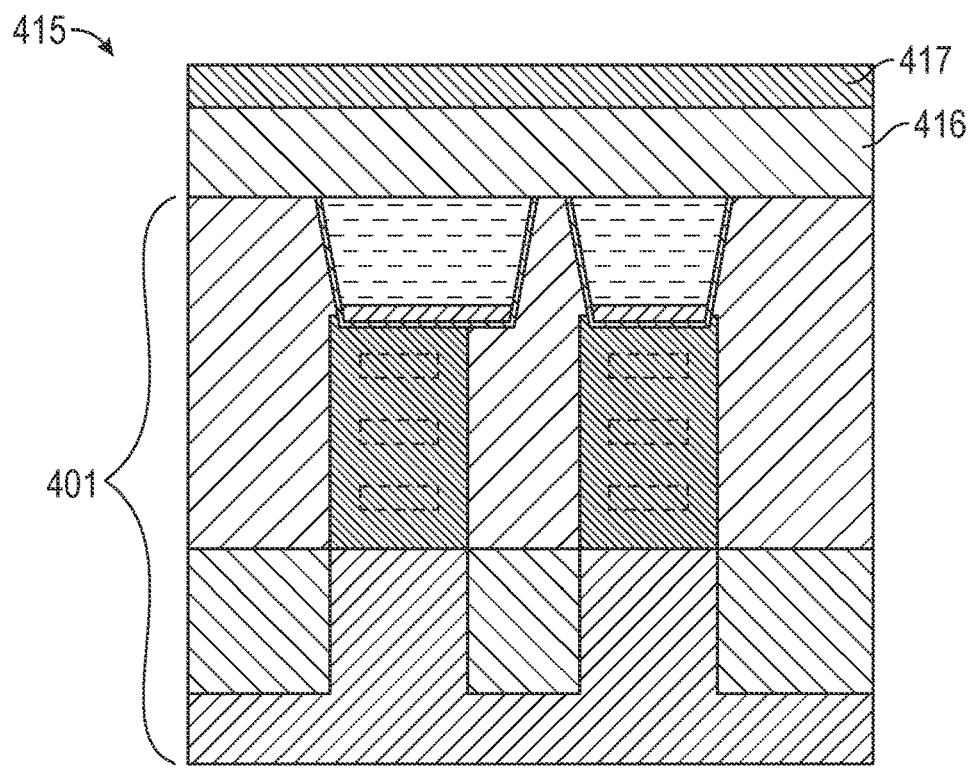
Figure 4D:
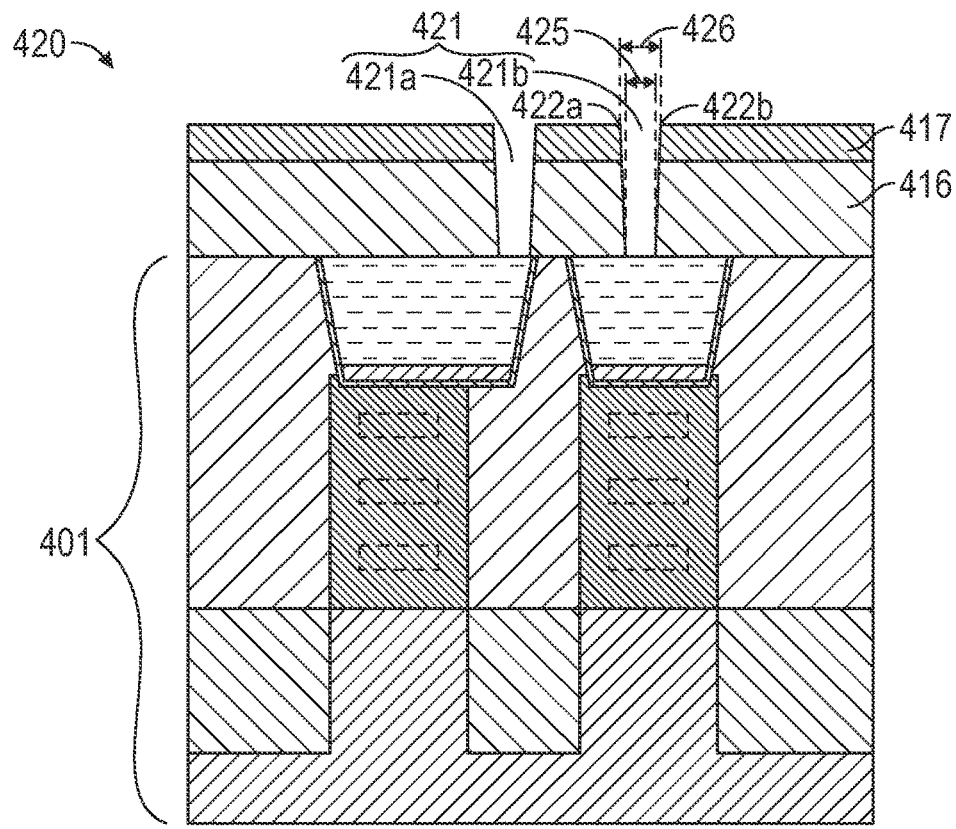
Figure 4E:
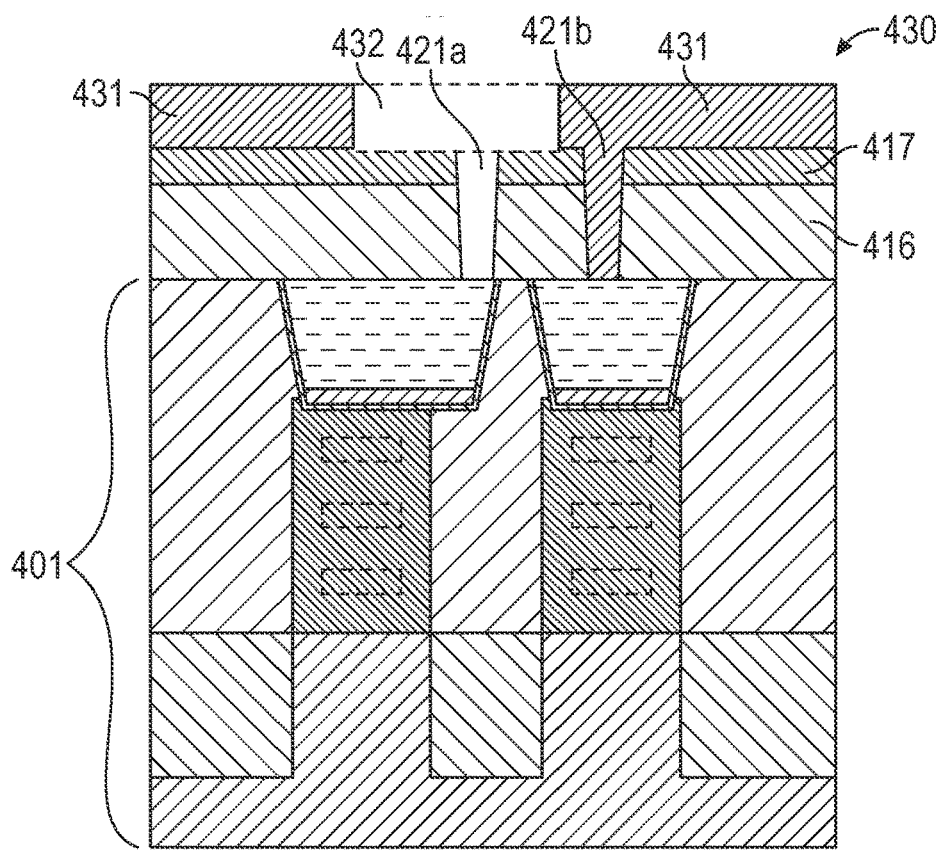
Figure 4F:
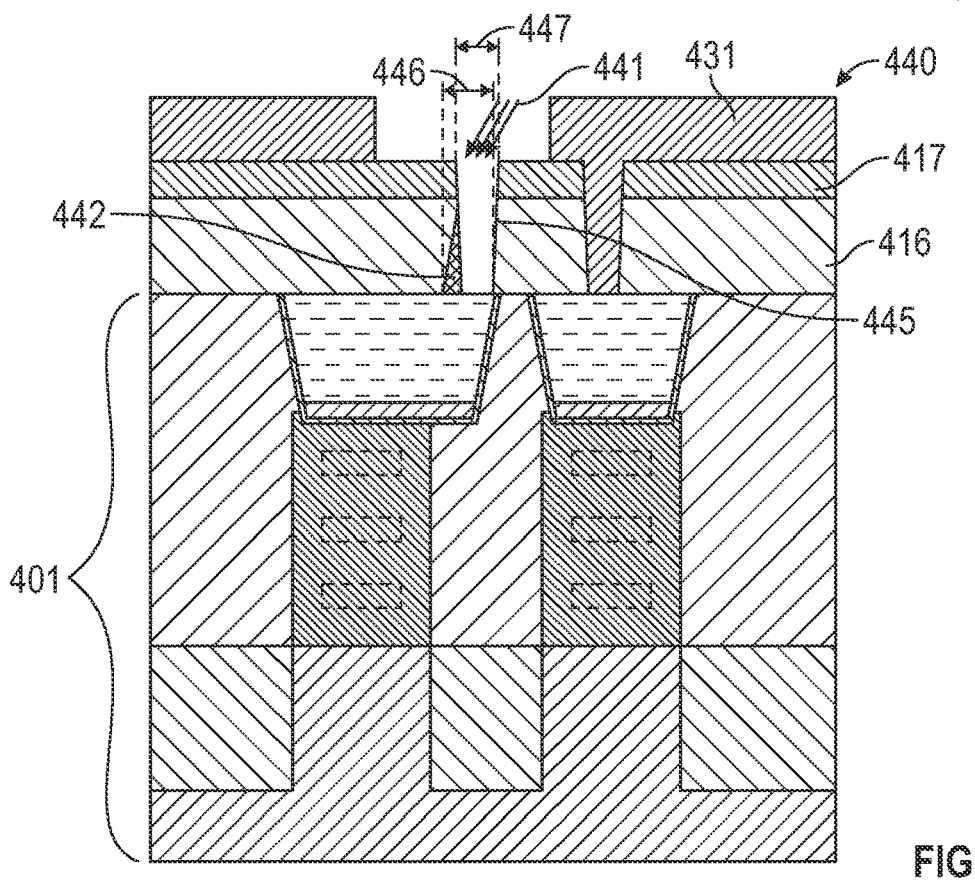

FIG. 3 is a flowchart of a method 300 for fabrication of an electronic package, according to embodiments of the present disclosure. Method 300 may be understood in conjunction with FIGS. 4A-I which illustrate a cross-section of an electronic package during fabrication, according to embodiments of the present disclosure.

As will be appreciated, because some of the Figures depict in-process fabrication of the vias and electronic package, a given figure may include temporary elements that are not included in the final device or have shapes and size of elements that differ from those in the final layout. Similarly, various elements may be absent at various stages of fabrication, and are therefore absent in view that would otherwise include those elements at a later time during fabrication. Additionally, although shown with various sizes, shapes, and quantities of components in the Figures, the elements are provided as non-limiting examples to illustrate potential embodiments of interconnect layers and vias, which may include different sizes, shapes, and quantities of components from those illustrated in the Figures. Furthermore, various elements may be intentionally omitted or resized to better show certain relationships between the other elements.

Method 300 begins at block 302 where a fabricator forms a metal contact over a S/D region of a transistor at an end of a front-end-of-line (FEOL) finishing process. In some examples, the metal contact includes a lined source/drain contact. In some examples, forming the metal contact includes the steps described in relation to FIGS. 4A-B. For example, at step 400, the fabricator completes the FEOL processes for finishing base layers of an electronic package. The base layers include substrate 402, STI layer 403, ILD layer 404, and S/D regions of nanosheet transistors 405.

At step 410, the fabricator forms contacts, such as contacts 411a and 411b. In some examples, the fabricator uses source/drain contact patterning and metallization processes to form a liner 412 for each of the contacts 411a and 411b and to form the contacts over the nanosheet transistors 405. The liner 412 may include a silicide liner (e.g., Ti, Ni, NiPt etc., formed by PVD, and a thin adhesion liner, such as TaN or titanium nitride (TiN) liner or other suitable liner material. The sidewall adhesion liner may also function as a diffusion barrier between ILD material and via metal fill. In some examples, conductive contact metals (such as W, Ru, Co, etc.) are deposited followed by a CMP process to polish the layers. The contacts 411a and 411b and base layers form a base structure 401 for the vias to be formed upon as described herein.

At block 304, the fabricator forms a via mold over a metal contact where the via mold includes a symmetrical tapered cross-sectional profile. For example, at step 415 in FIG. 4C, the fabricator deposits an ILD layer 416 and hardmask material 417 on the base structure 401. At step 420 shown in FIG. 4D, the fabricator forms a plurality of via molds 421. The plurality of via molds 421 includes via molds 421a and 421b. In some examples, the plurality of via molds 421 has a tapered symmetric cross-section profile shape. For example, the via mold 421b has a bottom width 425 and a top width 426. Additionally, the via mold 421b has a first sidewall 422a at a first angle in a first direction and a second sidewall 422b at the first angle in a second direction.

In some examples, a via formed in a symmetric via mold, such via mold 421a may limit a signal performance of an associated nanosheet such that a wider width of the via is needed. In some examples, a via formed in the via mold 421b may not limit an underlying nanosheet performance (e.g., when a large current is not expected). In order to target specific via molds for directional etching, the fabricator applies a softmask layer 431 (e.g. an organic planarization layer (OPL)), at step 430 in FIG. 4E to a subset of the plurality of via molds 421. The softmask layer 431 includes an opening section 432 which allows for directional etching of the via mold 421a. In some examples, the opening section 432 is patterned using conventional lithography and etch process.

At block 306, the fabricator applies a directional etch to the via mold, where the directional etch alters a first sidewall of the via mold and increases a bottom width of the via mold. For example, at step 440 in FIG. 4F, the fabricator applies directional etch 441 to the via mold in the hardmask material 417 and ILD layer 416 in order to increase a bottom width of the via mold 421a to a bottom width 446. In some examples, the directional etch includes angled etching, ion beam etching, ion implantation, and other directional etch methods. The directional etch removes directed portion 442 from the ILD layer 416, enlarging the via mold 421a to the asymmetric via mold 445. In some examples, the altered side wall of the mold 421a provides an altered geometry for the via. For example, a top width 447 of the asymmetric via mold 445 is smaller than the bottom width 446.

At block 308 forms an asymmetric via in the via mold. In some examples, the asymmetric via includes a first sidewall with the first slope angle in the first direction and a second sidewall with second slope angle in the first direction. In some examples, the first slope angle is different than the second slope angle. In some examples, using selectively grown metals from exposed metal contacts underneath the via, results in no void forming in the via molds, thus eliminating a need for liners in the vias. Additionally, metal liners may have higher resistivity compared to other conductive metals, where linerless vias have lower resistance compared to vias with liner. In some examples, the liners may be formed on the sidewalls of the asymmetric via to serve as diffusion barriers. In some examples, the via conductive metals can be re-flown to eliminate any void or seem formed during metal deposition process.

Figure 4G:
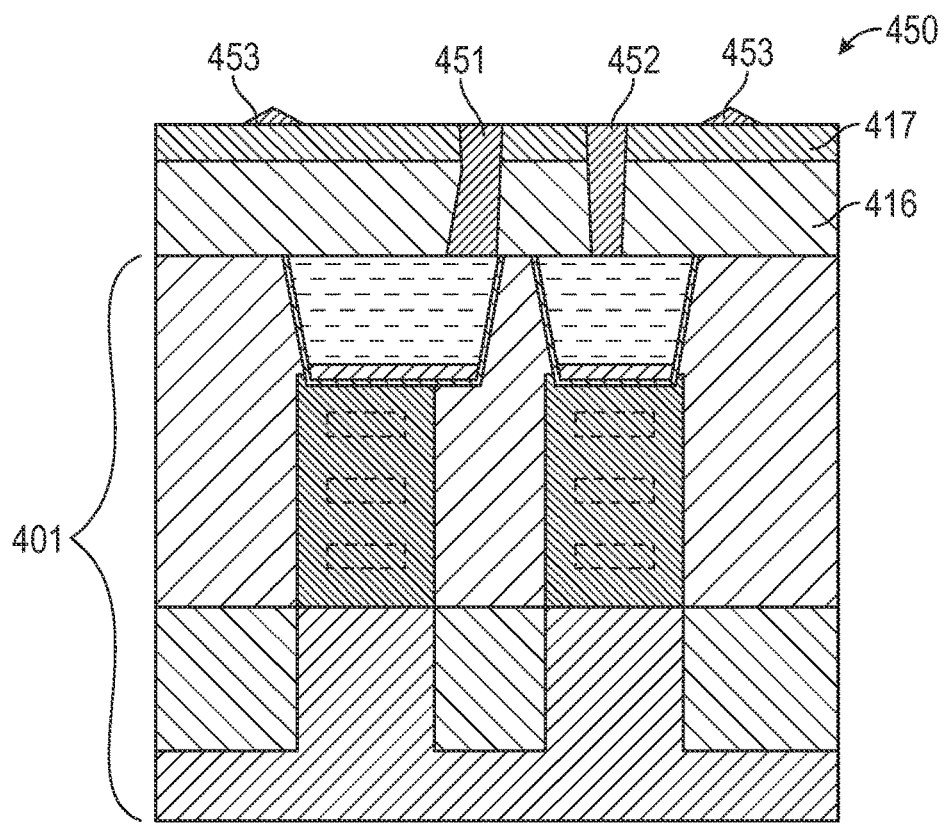
Figure 4H:
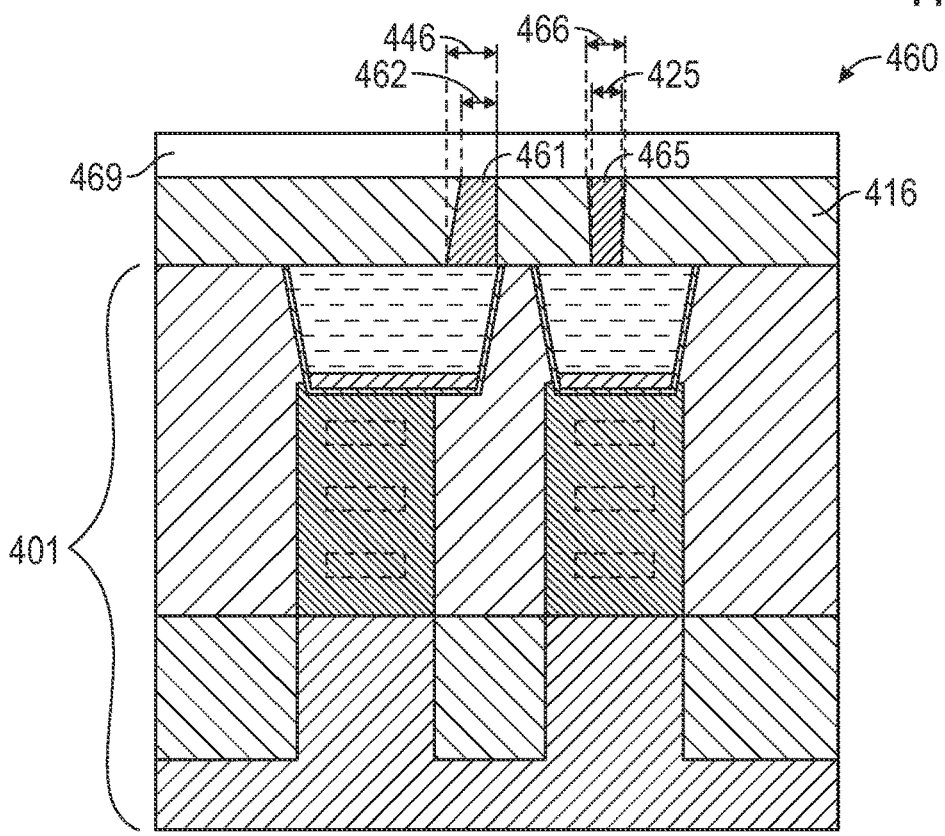
Figure 4I:
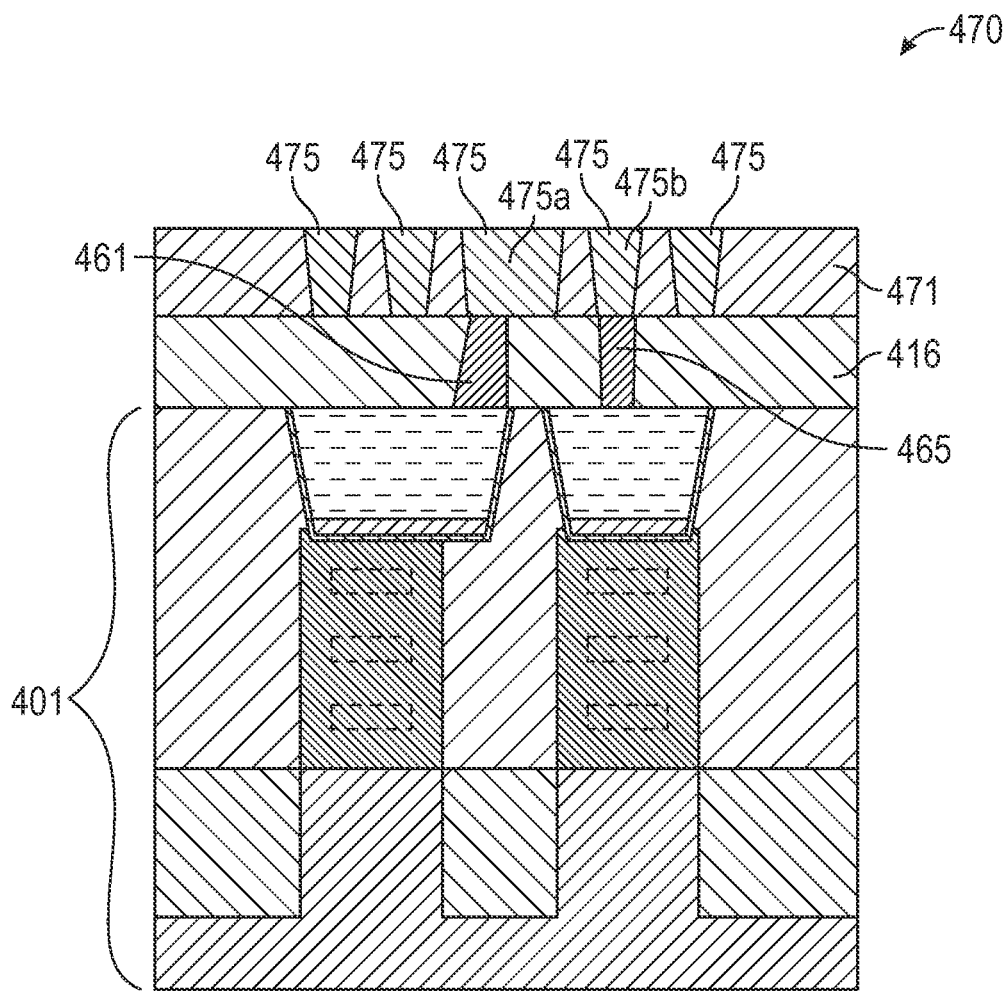

Forming the asymmetric via includes the steps shown in FIGS. 4G-4H. For example, at step 450, the fabricator removes the softmask layer 431 and applies a selective metal growth process to the via molds in the ILD layer 416 and hardmask material 417. In some examples, using a selective metal growth process avoids a need for a liner to be formed in the via molds prior to forming the vias. The selective metal growth process may deposit ruthenium (Ru), tungsten (W), Co, or other appropriate linerless metallic material to fill the via molds resulting in a linerless asymmetric via. In some examples, the selective metal growth grows metal from exposed metals in the contacts 411. In some examples, the selectivity of the growth is not a perfected process and may result in residual metals 453 growing from the hardmask material 417, which may be removed during finishing processes. The selective metal growth process also includes the growth of via structure 451 and via structure 452 in the respective via molds.

At step 460 in FIG. 4H, the fabricator removes layer 469 (including, residual metals 453, the hardmask material 417, and a portion of the ILD layer 416) via CMP or other polishing/etching processes to form a linerless asymmetric via 461 and linerless symmetric via 465. In some examples, the fabricator forms a plurality of asymmetric vias and symmetric vias. In some examples, the linerless asymmetric via 461 has a bottom width 446 and a top width 462, where the bottom width is larger/longer than the top width. In another example, the linerless symmetric via 465 has a bottom width 425 and a top width 466, where the bottom width is smaller than the top width.

At block 310, the fabricator forms one or more metal lines overs the asymmetric via and a plurality of additional vias. For example, at step 470 in FIG. 4I, the fabricator performs BEOL process to deposit an ILD layer 471 and form M1 metal lines such as the lines 475 in the ILD layer 471. In some examples, the fabricator forms a power rail 475a over the linerless asymmetric via 461 and a metal line 475b over the linerless symmetric via 465. While shown in FIG. 4I as one linerless asymmetric via 461, the package is in FIG. 4 may include a plurality of linerless asymmetric vias able to conduct larger currents/signals through the package layers such as from power rail 475a to the nanosheets transistors 405, among others.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

In the preceding, reference is made to embodiments presented in this disclosure. However, the scope of the present disclosure is not limited to specific described embodiments. Instead, any combination of the features and elements, whether related to different embodiments or not, is contemplated to implement and practice contemplated embodiments. Furthermore, although embodiments disclosed herein may achieve advantages over other possible solutions or over the prior art, whether or not a particular advantage is achieved by a given embodiment is not limiting of the scope of the present disclosure. Thus, the aspects, features, embodiments and advantages discussed herein are merely illustrative and are not considered elements or limitations of the appended claims except where explicitly recited in a claim(s). Likewise, reference to "the invention" shall not be construed as a generalization of any inventive subject matter disclosed herein and shall not be considered to be an element or limitation of the appended claims except where explicitly recited in a claim(s).

The invention claimed is:

1. An electronic package comprising:
   a first layer;
   a second layer; and
   a via layer between the first layer and the second layer comprising an asymmetric via formed in the via layer, wherein the asymmetric via comprises:
   a top side that contacts the second layer;
   a bottom side that contacts the first layer, wherein the bottom side is parallel with the top side;
   a first sidewall with a first slope angle in a first direction between the first layer and the second layer; and
   a second sidewall with a second slope angle in the first direction between the first layer and the second layer, wherein the second slope angle is different from the first slope angle.

2. The electronic package of claim 1, wherein the first layer comprises at least one source/drain contact, wherein the asymmetric via is positioned on a top surface of the at least one source/drain contact.

3. The electronic package of claim 1, wherein the second layer comprises one at least one metal line, wherein the at least one metal line is positioned on a top surface of the asymmetric via in the via layer.

4. The electronic package of claim 1, further comprising:
a source/drain region of a nanosheet layer, wherein the first layer is formed on the source/drain region, wherein the first layer and the via layer provide an electrical connection between the nanosheet layer and the second layer.

5. The electronic package of claim 1, wherein the via layer comprises a plurality of additional asymmetric vias formed in the via layer.

6. The electronic package of claim 1, wherein the bottom side comprises a bottom width and the top side comprises a top width, wherein the bottom width is larger than the top width.

7. The electronic package of claim 1, further comprising a plurality of symmetric vias in the via layer, wherein a cross-sectional profile is symmetrical for the plurality of symmetric vias.

8. A via connection layer comprising:
an asymmetric via formed in the via connection layer, wherein the asymmetric via comprises:
a top side that contacts a second layer;
a bottom side that contacts a first layer, wherein the bottom side is parallel with the top side;
a first sidewall, where the first sidewall comprises a first slope angle in a first direction; and
a second sidewall, wherein the second sidewall comprises a second slope angle in the first direction, wherein the second slope angle is different from the first slope angle.

9. The via connection layer of claim 8, wherein the asymmetric via is formed on a top surface of at least one source/drain contact.

10. The via connection layer of claim 9, wherein at least one metal line is formed on the via connection layer, wherein the at least one metal line is formed on a top surface of the asymmetric via in the via connection layer.

11. The via connection layer of claim 10, further comprising:
a source/drain region of a nanosheet layer in connection with the via connection layer through at least one source/drain contact, wherein the via connection layer provides an electrical connection between the nanosheet layer and the at least one metal line.

12. The via connection layer of claim 8, wherein the via connection layer comprises a plurality of additional asymmetric vias.

13. The via connection layer of claim 8, wherein the bottom side comprises a bottom width and the top side comprises a top width, wherein the bottom width is larger than the top width.

14. The via connection layer of claim 8, further comprising a plurality of symmetric vias in the via connection layer, wherein a cross-sectional profile is symmetrical for the plurality of symmetric vias.

* * * * *